US010897817B2

(12) United States Patent
Iwamoto et al.

(10) Patent No.: US 10,897,817 B2
(45) Date of Patent: Jan. 19, 2021

(54) THERMALLY EXPANDABLE MATERIAL, SHEET MATERIAL, CIRCUIT BOARD, METHOD FOR MANUFACTURING CIRCUIT BOARD, COMPUTER READABLE STORAGE MEDIUM, ELECTRONIC APPARATUS, AND STRUCTURE TO ANALYZE HEAT-GENERATION POSITION

(71) Applicant: CASIO COMPUTER CO., LTD., Tokyo (JP)

(72) Inventors: Kenji Iwamoto, Kokubunji (JP); Satoshi Kurosawa, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 16/514,971

(22) Filed: Jul. 17, 2019

(65) Prior Publication Data
US 2020/0037445 A1    Jan. 30, 2020

(30) Foreign Application Priority Data

Jul. 25, 2018    (JP) .................... 2018-139792

(51) Int. Cl.
| H05K 1/03 | (2006.01) |
| H05K 1/02 | (2006.01) |
| H05K 1/18 | (2006.01) |
| H05K 3/00 | (2006.01) |
| H05K 3/28 | (2006.01) |

(52) U.S. Cl.
CPC ......... *H05K 1/0393* (2013.01); *H05K 1/0201* (2013.01); *H05K 1/029* (2013.01); *H05K 1/0287* (2013.01); *H05K 1/189* (2013.01); *H05K 3/0005* (2013.01); *H05K 3/28* (2013.01); *H05K 2201/06* (2013.01); *H05K 2203/1105* (2013.01)

(58) Field of Classification Search
CPC .. H05K 1/0393; H05K 1/0201; H05K 1/0287; H05K 1/029; H05K 1/189; H05K 3/0005
USPC ........................................ 174/254
See application file for complete search history.

(56) References Cited

U.S. PATENT DOCUMENTS 5,639,540 A    6/1997    Imaeda

FOREIGN PATENT DOCUMENTS

| JP | H0825785 A | 1/1996 |
| JP | 2000223795 A | 8/2000 |
| JP | 2001042763 A | 2/2001 |
| JP | 2007194069 A | 8/2007 |

(Continued)

OTHER PUBLICATIONS

Sumihara, Machine Translation of JP 2007-273127 (Oct. 18, 2007) (Year: 2007).*

(Continued)

*Primary Examiner* — Tremesha S Willis
(74) *Attorney, Agent, or Firm* — Holtz, Holtz & Volek PC

(57) ABSTRACT

A thermally expandable material includes microcapsules and a binder having a conducting property, each microcapsule including a shell having an insulating property, and a thermally expandable component contained in the shell and having a property of expanding by heating, the shell deforming due to expansion of the thermally expandable component to come in contact with another capsule and have an insulating state with the other capsule.

8 Claims, 14 Drawing Sheets

(56) References Cited

FOREIGN PATENT DOCUMENTS

| | | | |
|---|---|---|---|
| JP | 2007273127 | A | 10/2007 |
| JP | 2008269883 | A | 11/2008 |

OTHER PUBLICATIONS

Japanese Office Action (and English language translation thereof) dated Sep. 8, 2020 issued in Japanese Application No. 2018-139792.

* cited by examiner (CONDUCTING STATE)

(CONDUCTING STATE)

(INSULATING STATE)

THERMALLY EXPANDABLE MATERIAL, SHEET MATERIAL, CIRCUIT BOARD, METHOD FOR MANUFACTURING CIRCUIT BOARD, COMPUTER READABLE STORAGE MEDIUM, ELECTRONIC APPARATUS, AND STRUCTURE TO ANALYZE HEAT-GENERATION POSITION

BACKGROUND

1. Field

The present invention relates to thermally expandable materials, sheet materials, circuit boards, methods for manufacturing circuit board, computer readable storage media, electronic apparatuses, and structures to analyze a heat-generation position.

2. Related Art

According to a conventional method of creating a conductive circuit, e.g., a flexible wiring board described in JP 2000-223795 A, an operator at the field firstly creates an electronic circuit diagram (see FIG. 9A, for example) with a CAD (Computer-Aided Design) system. Next, the operator prepares a base material and fabricates a flexible wiring board (see FIG. 9B, for example) by machining the base material with a specialized machine. FIG. 9A shows one example of an electronic circuit diagram 90 created with a CAD system. FIG. 9B shows one example of a flexible wiring board 300.

To create a circuit with a universal board (see FIG. 9C, for example) described in JP 2001-42763 A, for example, an operator manually connects solder with the board. FIG. 9C shows an example of a universal board 400.

Such a field of creating a conductive circuit needs a circuit board having the wiring function equivalent to a flexible wiring board and a universal board, and that can be created easily in a short time and at low cost.

The afore-mentioned flexible wiring board described in JP 2000-223795 A, for example, is manufactured by creating an electronic circuit diagram with a CAD (Computer-Aided Design) system, and then preparing a base material and fabricating a flexible wiring board by machining the base material with a specialized machine. The creation of such a flexible wiring board therefore is limited to experts having an advanced knowledge of the field and requires certain time for creation. The creation of such a flexible wiring board also needs the cost, including the material cost and the facility cost. It is therefore difficult to prepare a plurality of types of flexible wiring boards. If the validation result of the created flexible wiring board shows an unfavorable operation, the operator is required to repeat the same job, which also needs a lot of cost and time for creation.

To create a circuit with the afore-mentioned universal board described in JP 2001-42763 A, for example, an operator manually connects solder with the board. Such creation of a circuit with a universal board therefore is a burden for the operator and requires certain time for preparation. If the validation result of the created circuit shows an unfavorable operation, the operator is required to create another circuit again, which also requires a lot of cost and time for creation.

The present invention aims to provide a circuit board having the wiring function equivalent to a flexible wiring board and a universal board, and that can be prepared easily in a short time and at low cost.

SUMMARY

A thermally expandable material includes microcapsules and a binder having a conducting property, each microcapsule including a shell having an insulating property, and a thermally expandable component contained in the shell and having a property of expanding by heating, the shell deforming due to expansion of the thermally expandable component to come in contact with another capsule and have an insulating state with the other capsule.

A sheet material includes: a base layer; and a thermally expandable layer disposed on the base layer, the thermally expandable layer including microcapsules and a binder having a conducting property, each microcapsule including a shell having an insulating property, and a thermally expandable component contained in the shell and having a property of expanding by heating, the shell defining an insulating region due to expansion of the thermally expandable component.

A method for manufacturing a circuit board, includes: a first step of preparing a sheet material including a base layer and a thermally expandable layer disposed on the base layer; and a second step of expanding the sheet material partially so that an expanding region of the thermally expandable layer defines an insulating region of a circuit and a not-expanding region of the thermally expandable layer defines a conducting region of the circuit, the thermally expandable layer including microcapsules and a binder having a conducting property, each microcapsule including a shell having an insulating property, and a thermally expandable component contained in the shell and having a property of expanding by heating, the shell at the expanding region deforming due to expansion of the thermally expandable component to come in contact with another capsule and have an insulating state with the other capsule.

A computer readable storage medium has stored thereon a program that is executable by a computer, and the program makes the computer implement the following functions to control a device to create a conversion diagram: preparing an electronic circuit diagram data to create an electronic circuit diagram; and forming an image with photothermal ink based on the electronic circuit diagram data so that a thermally expandable layer of a sheet material to make up a circuit board expands at a part or all of an insulating region of the electronic circuit diagram data.

An electronic apparatus has a part through which an electric current flows, and includes microcapsules disposed around the part, each microcapsule including a shell having an insulating property, and a thermally expandable component contained in the shell and having a property of expanding by heating, the electronic apparatus being configured to, in case of an unexpected short-circuit, expand the microcapsules due to heat generated from the short-circuit so as to insulate a part around the short-circuit.

A structure to analyze a heat-generation position, includes microcapsules disposed at any position of a product, each microcapsule including a shell having an insulating property, and a thermally expandable component contained in the shell and having a property of expanding by heating, the structure being configured to allow analysis of an expanding region, if any, of the microcapsules so as to enable analysis of an unexpected heat-generation position of the product.

DETAILED DESCRIPTION

The following describes an embodiment of the present invention (hereinafter called a present embodiment) in details, with reference to the drawings. The drawings are just schematic views to enable sufficient understanding of the present invention. The present invention therefore is not limited to the examples shown in these drawings. Like numbers indicate like components throughout the drawings, and their detailed descriptions are omitted.

Embodiment

A circuit board 30 (see FIG. 5C) of the present embodiment is created with a sheet material 40 (see FIG. 1A) described later.

This sheet material 40 includes a thermally expandable layer 42 (see FIG. 1A) described later. When heated, this thermally expandable layer 42 partially expands to be a desired pattern. This expansion of the thermally expandable layer creates a circuit board 30 (see FIG. 5C).

<Configuration of a Sheet Material to Create a Circuit Board>

Figure 1A:
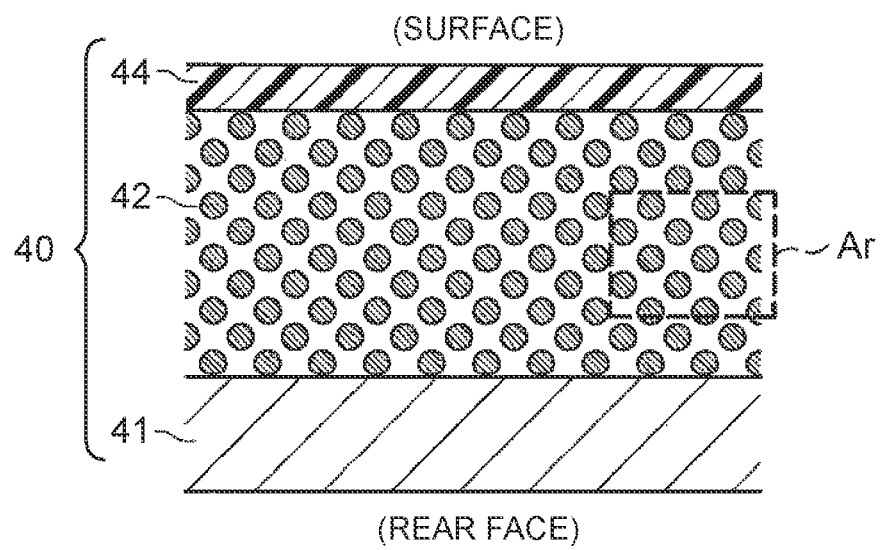
FIG. 1A shows the configuration of a sheet material according to one embodiment.
Figure 1B:
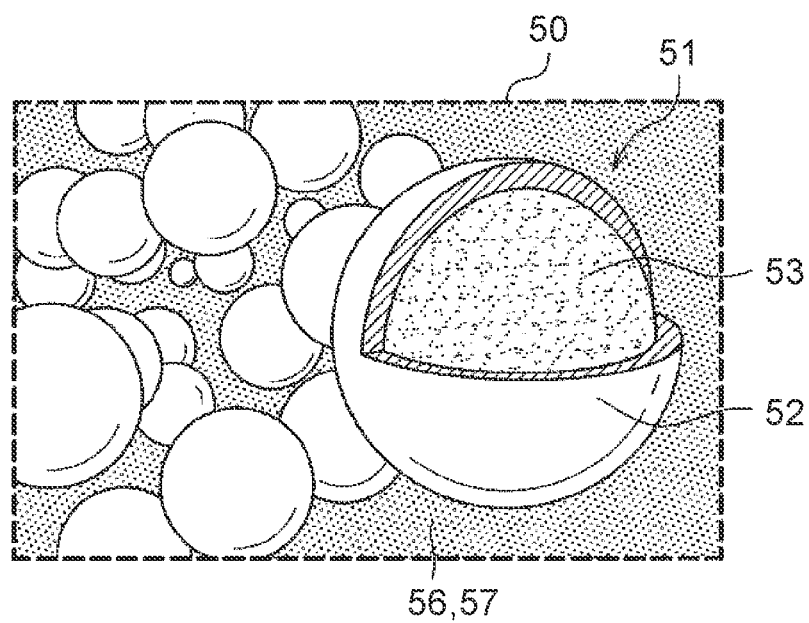
FIG. 1B shows the structure of a thermally expandable layer of a sheet material according to one embodiment.
Figure 5A:
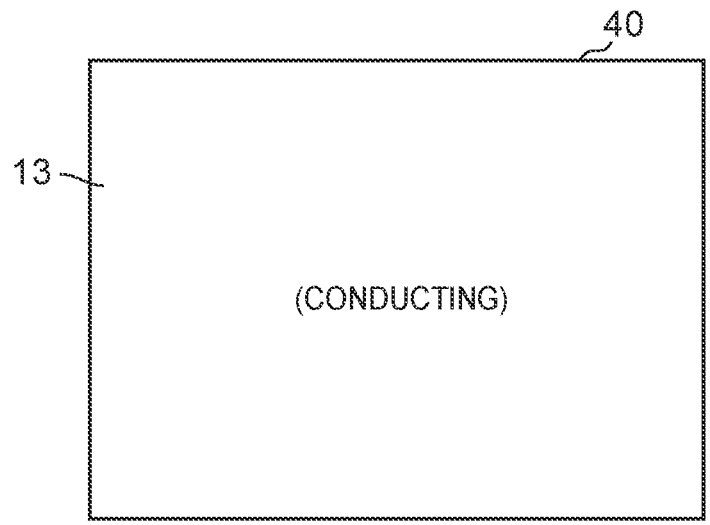
FIG. 5A is drawing (1) that shows a creation example of a circuit board.
Figure 5B:
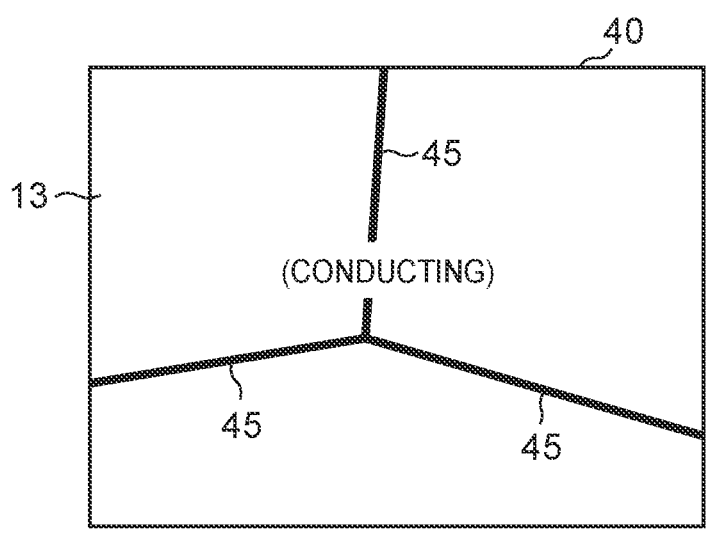
FIG. 5B is drawing (2) that shows a creation example of a circuit board.
Figure 5C:
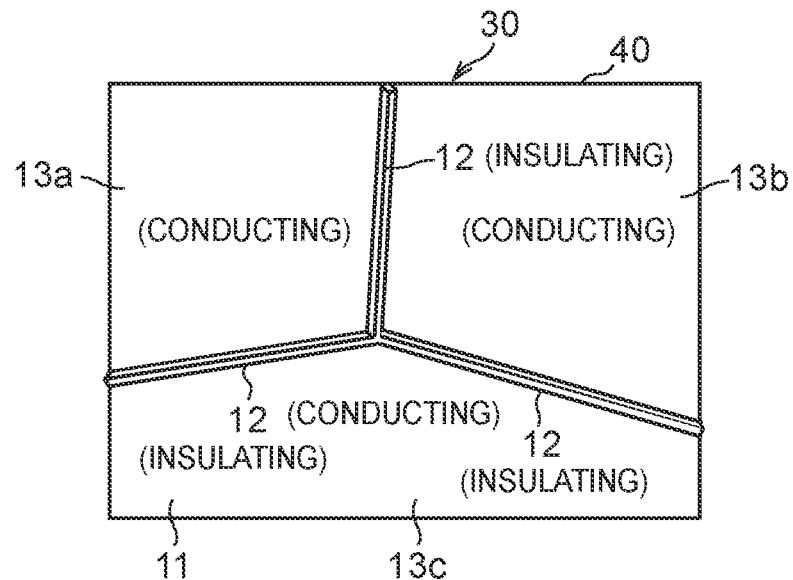
FIG. 5C is drawing (3) that shows a creation example of a circuit board.

Referring to FIG. 1A and FIG. 1B, the following describes the configuration of a sheet material 40 to create a circuit board 30 (see FIG. 5C). FIG. 1A shows the configuration of the sheet material 40. FIG. 1B shows the configuration of a thermally expandable material used for the thermally expandable layer 42 (see FIG. 1A) of the sheet material 40. FIG. 1B is an enlarged view of region Ar of the thermally expandable layer 42 in FIG. 1A.

As shown in FIG. 1A, the sheet material 40 includes the thermally expandable layer 42 and a microfilm 44 on a base layer (base) 41.

The base layer (base) 41 includes paper or resin, such as PET (polyethylene terephthalate). The base layer 41 preferably has heat resistance. The base layer 41 preferably is flexible moderately.

The thermally expandable layer 42 expands by heating.

Figure 2A:
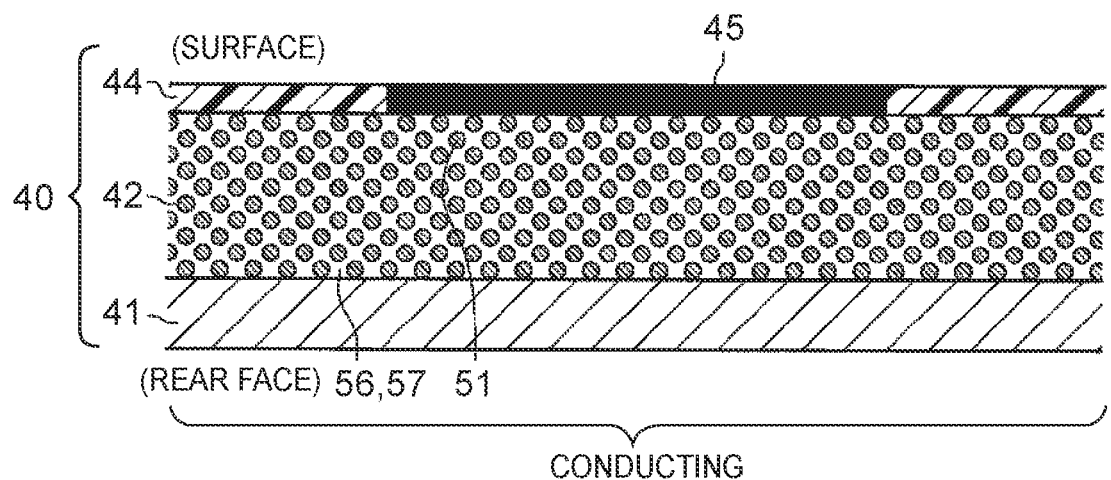
FIG. 2A is drawing (1) that shows the formation step of a circuit board.

The microfilm 44 is a layer to print (apply) photothermal ink 45 (see FIG. 2A).

As shown in FIG. 1B, the thermally expandable layer 42 includes thermally expandable ink 50 as a thermally expandable material. In one example, the thermally expandable layer 42 is formed by applying the thermally expandable ink 50 that is a thermally expandable material in the liquid form on the base layer 41, followed by drying.

The thermally expandable ink 50 (thermally expandable material) includes microcapsules 51 having an insulating property that are mixed in a binder 56 having a conducting property. Photothermal ink 45 is printed (applied) at the microfilm 44 (see FIG. 2A) of the sheet material 40. When such a sheet material 40 is irradiated with light, the thermally expandable layer 42 at a part corresponding to the printed region expands.

The binder 56 includes emulsion of a resin material. Emulsion is a substance including a dispersion medium and dispersed material, both of which are in the liquid form. The binder 56 includes a metal filler 57 as a conductive component.

Each microcapsule 51 includes a shell 52 and a core 53. The core 53 is a thermally expandable component contained in the shell 52. FIG. 1B shows the contained core 53 by cutting the shell 52 at an about quarter part on the front. In one example, the shell 52 includes acrylonitrile copolymer as thermoplastic resin. The shell 52 has an insulating property. The core 53 contained in the shell 52 includes hydrocarbon 54, and has an insulating property. The hydrocarbon 54 has a thermally expandable property that expands by heating.

"Thermoplasticity" of a material as stated above refers to a property that the material is plastically deformed when it is heated under pressure. "Thermal expandable property" of a material as stated above refers to a property that the material expands when it is heated.

Preferably the hydrocarbon 54 is in the liquid form and has a relatively low boiling point (liquid low-boiling hydrocarbon). In one example, the hydrocarbon 54 includes the following components in the increasing order of the number of carbons.

Methane ($CH_4$), ethane ($C_2H_6$), propane ($C_3H_8$), butane ($C_4H_{10}$), pentane ($C_5H_{12}$), hexane ($C_6H_{14}$), heptane ($C_7H_{16}$), octane ($C_8H_{18}$), nonane ($C_9H_{20}$, and decane ($C_{10}H_{22}$).

The boiling point of the hydrocarbon 54 increases with the number of carbons. In one example, the above-mentioned components have the following boiling points.

The boiling points of methane, ethane, propane, butane, pentane, hexane, heptane, octane, nonane, and decane are −162° C., −89° C., −42° C., −1° C., 36.1° C., 68° C., 98.42° C., 125° C., 151° C., and 174.1° C., respectively.

In the present embodiment, the hydrocarbon 54 includes a single component or two or more types of components in combination of these components so that the hydrocarbon expands at a desired temperature (expansion temperature).

The core 53 of each microcapsule 51 expands by heating. The shell 52 of the microcapsule 51 deforms so as to extend with the expansion of the core 53 (thermally expandable component). The shell 52 has an insulating property, and so when the shell 52 deforms due to the expansion of the core 53 (thermally expandable component), the shell 52 comes in contact with another capsule to form an insulating region between these capsules.

<Formation Step of Circuit Board>

Referring to FIG. 2A to FIG. 2D, the following describes a formation step of the circuit board 30. FIG. 2A to FIG. 2D show the formation steps of the circuit board 30, showing a change in the cross-sectional shape of the sheet material 40.

As shown in FIG. 2A, the overall region of the sheet material 40 is a conducting region. The operator sets such a sheet material 40 at a not-illustrated printer of an ink-jet scheme. The operator then prints (applies) photothermal ink 45 at a region of the microfilm 44 corresponding to the region of the thermally expandable layer 42 to be expanded with the not-illustrated printer. In the present embodiment, the "region of the thermally expandable layer 42 to be expanded" defines an insulating region. The photothermal ink 45 is black ink including carbon black. The photothermal ink 45 absorbs light and converts the absorbed light into heat.

Figure 2B:
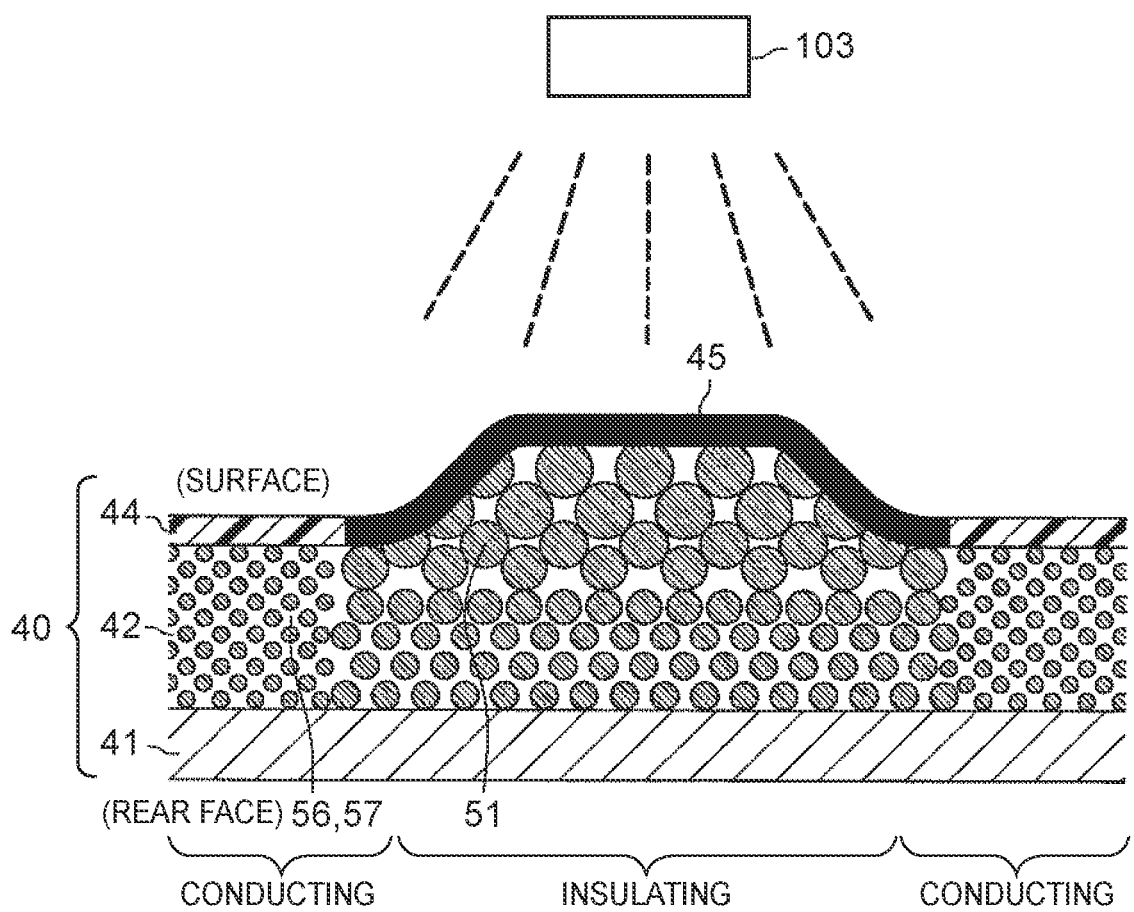
FIG. 2B is drawing (2) that shows the formation step of a circuit board.

Next as shown in FIG. 2B, the operator disposes the sheet material 40 with the printed photothermal ink 45 near a heater 103 (heat source), and applies light to the sheet material 40 from the heater 103. In one example, the heater 103 (heat source) includes a halogen heater. When irradiated with light from the heater 103, the photothermal ink 45 of the sheet material 40 converts the light into heat. Then the thermally expandable layer 42 located under the printed region of the photothermal ink 45 reacts to the heat and partially expands. This forms an expanding region in the sheet material 40.

The expanding region of the sheet material 40 defines an insulating region, and a not-expanding region of the sheet material 40 defines a conducting region. The principle to change the layer structure in this way is described later referring to FIG. 3A to FIG. 3C.

Figure 2C:
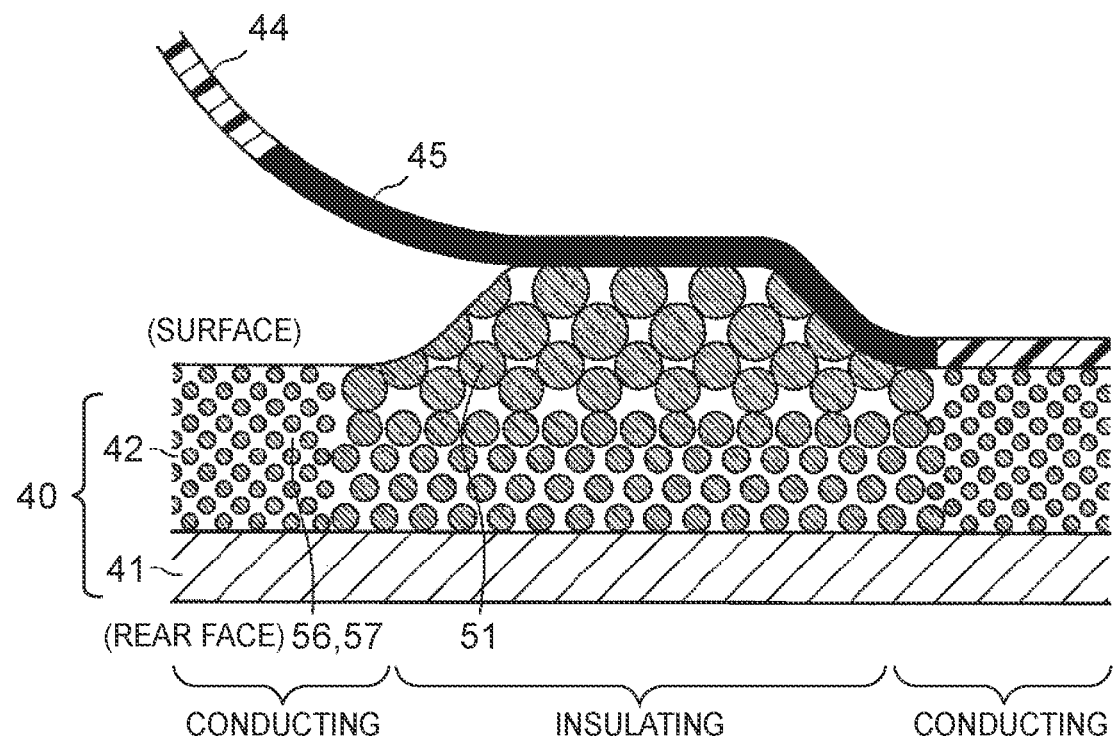
FIG. 2C is drawing (3) that shows the formation step of a circuit board.
Figure 2D:
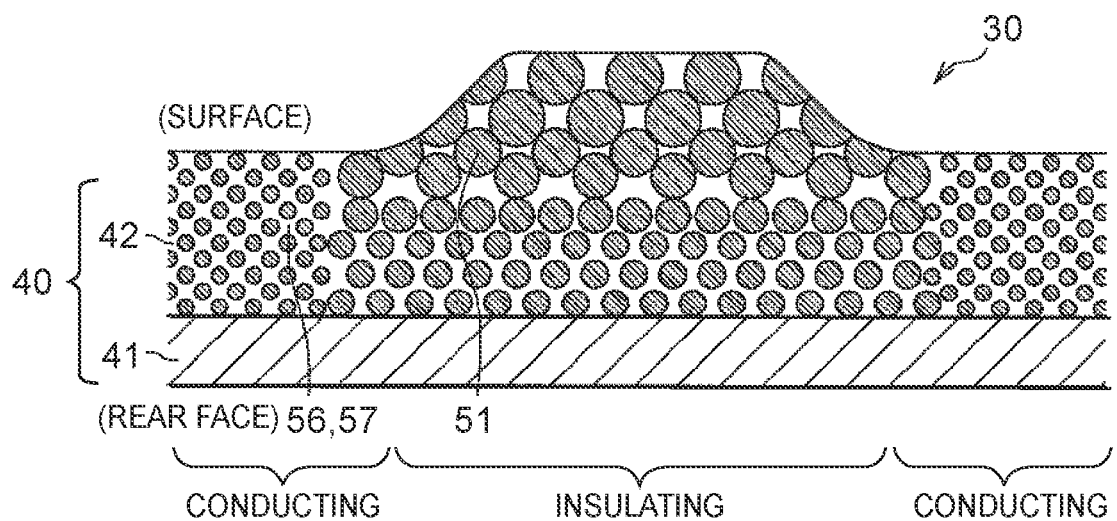
FIG. 2D is drawing (4) that shows the formation step of a circuit board.

Next as shown in FIG. 2C, the operator peels off the microfilm 44 from the thermally expandable layer 42 for removal. In this way the operator exposes the thermally expandable layer 42 as shown in FIG. 2D.

Using such a sheet material 40, the operator forms a circuit board 30 having a conductive circuit with an insulating region of any pattern.

<Principle to Change the Layer Structure>

Figure 3A:
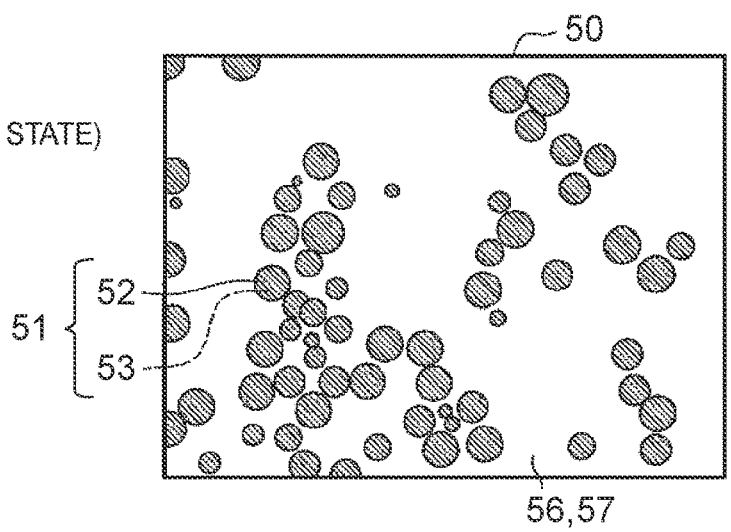
FIG. 3A shows a region of the thermally expandable layer to be expanded and shows the state before expansion.
Figure 3B:
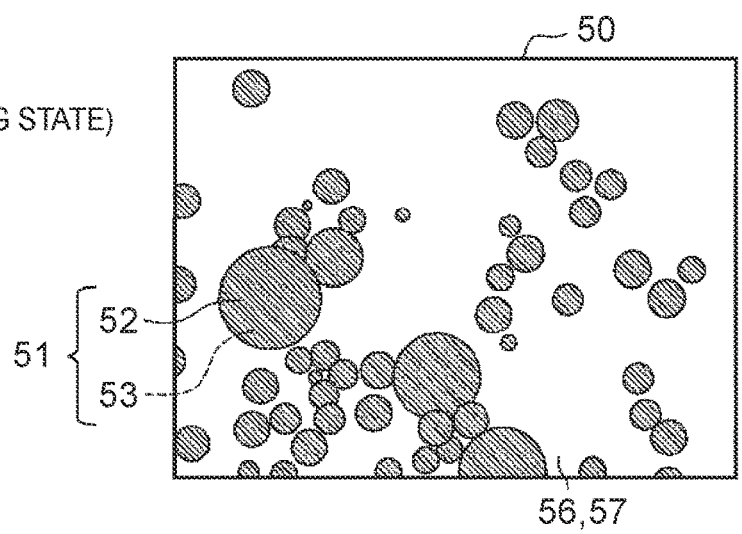
FIG. 3B shows the region of the thermally expandable layer to be expanded and shows the state during expansion.
Figure 3C:
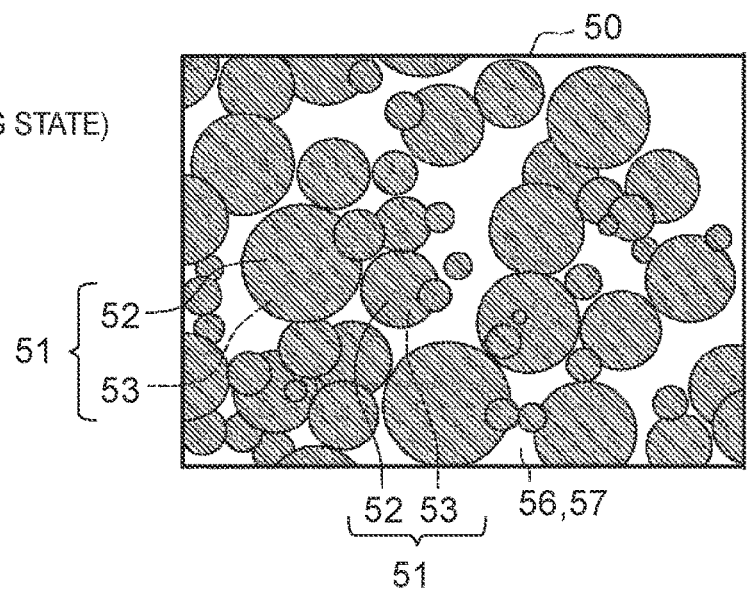
FIG. 3C shows the region of the thermally expandable layer to be expanded and shows the state after expansion.

The thermally expandable layer 42 of the sheet material 40 changes in the layer structure as shown in FIG. 3A, FIG. 3B and FIG. 3C, showing the state before expansion, during expansion, and after expansion, respectively. FIG. 3A shows a region of the thermally expandable layer 42 to be expanded and shows the state before expansion. FIG. 3B shows the region of the thermally expandable layer 42 to be expanded and shows the state during expansion. FIG. 3C shows the region of the thermally expandable layer 42 to be expanded and shows the state after expansion.

As shown in FIG. 3A, before expansion of the thermally expandable layer 42, none of the microcapsules 51 mixed in the thermally expandable layer 42 expand at the region of the thermally expandable layer 42 to be expanded. Most of the microcapsules 51 therefore are not in contact with other capsules at their shells 52. In this state, a sufficient amount of the conducting binder 56 is present around of most of the microcapsules 51. This means that the region of the thermally expandable layer 42 to be expanded in this state defines a conducting region.

As shown in FIG. 3B, during expansion of the thermally expandable layer 42, a very limited part of the microcapsules 51 mixed in the thermally expandable layer 42 expands at the region of the thermally expandable layer 42 to be expanded. Although a part of the microcapsules 51 is in contact with other capsules at the shells 52, most of the microcapsules 51 still are not in contact with other capsules at their shells 52. In this state, a sufficient amount of the conducting binder 56 is still present around most of the microcapsules 51. This means that the region of the thermally expandable layer 42 to be expanded in this state still defines a conducting region.

As shown in FIG. 3C, after expansion of the thermally expandable layer 42, a part (or all) of the microcapsules 51 mixed in the thermally expandable layer 42 expands at the region of the thermally expandable layer 42 to be expanded. Most of the microcapsules 51 therefore are in contact with other capsules at their shells 52. In this state, only a small amount of the conducting binder 56 is present around the microcapsules 51. The insulating shells 52 are in contact with other capsules and so keep continuity with the other capsules. This means that the expanding region of the thermally expandable layer 42 defines an insulating region. Preferably the expanding region of the thermally expandable layer 42 has elasticity.

<Creation of a Conversion Diagram>

Figure 4A:
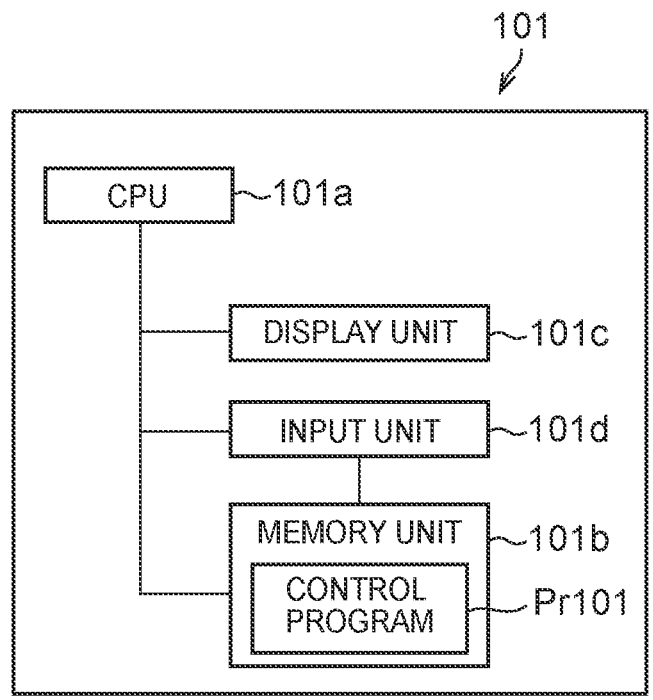
FIG. 4A shows one example of a conversion-diagram creation device.
Figure 4B:
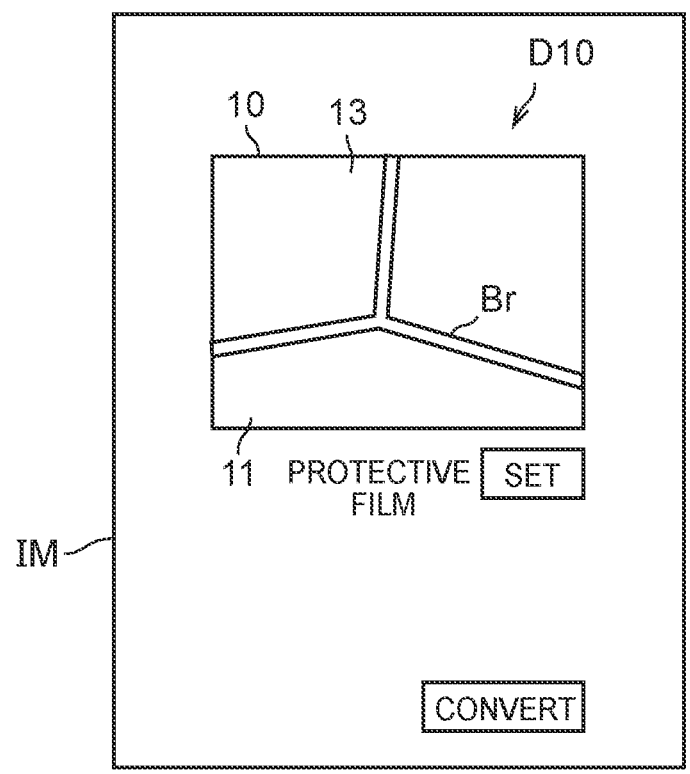
FIG. 4B is a drawing (1) that shows an example of an input screen.
Figure 4C:
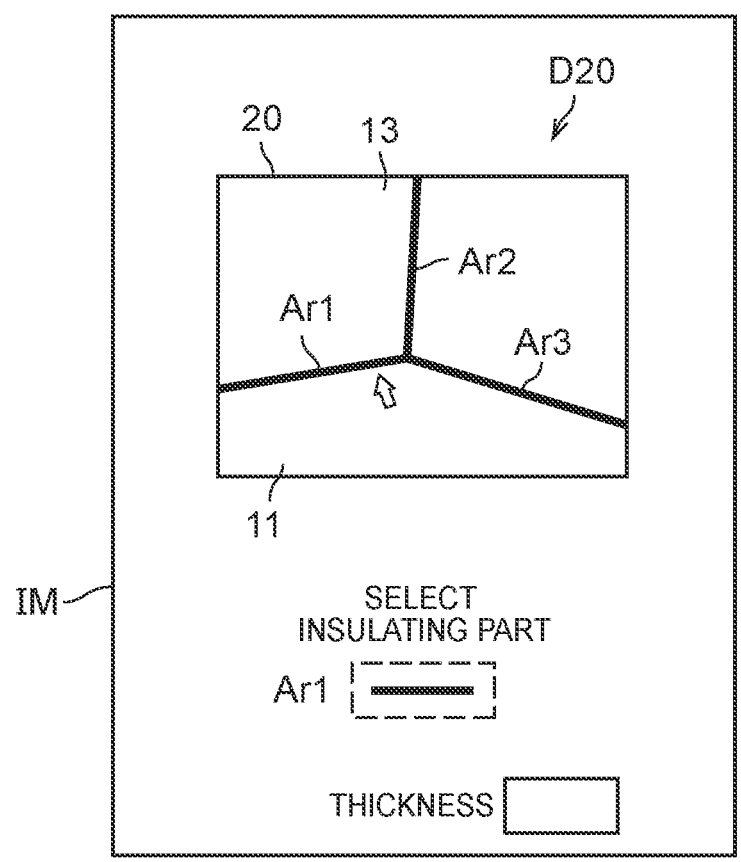
FIG. 4C is a drawing (2) that shows an example of an input screen.

The operator to create the circuit diagram 30 (see FIG. 5C) prepares an electronic circuit diagram data D10 (see FIG. 4B) for an electronic circuit diagram 10 (see FIG. 4B) designed beforehand, for example. The operator may design an electronic circuit diagram 10 of various patterns (see FIG. 4B) depending on the operations. To create the circuit board 30 (see FIG. 5C), the operator uses a computer 101 of FIG. 4A, for example, that functions as a conversion-diagram creation device. The computer 101 creates a conversion diagram data D20 indicating a conversion diagram 20 (see FIG. 4C) corresponding to the electronic circuit diagram 10 (see FIG. 4B). The conversion diagram 20 shows an image to be formed with the photothermal ink 45. FIG. 4A shows one example of the conversion-diagram creation device. FIG. 4B and FIG. 4C show an example of an input screen IM.

In the example of FIG. 4B, the electronic circuit diagram 10 of the electronic circuit diagram data D10 shows a circuit 11 including an insulating region Br in a conducting region 13. In the example of FIG. 4B, the input screen IM includes a "set" button and a "convert" button. The "set" button is to set a region of a protective film 29 (see FIG. 6C) described later that is formed with insulating ink having an insulating property. The "convert" button is to create a conversion diagram 20 (see FIG. 4C) from the electronic circuit diagram 10.

As shown in FIG. 4A, the computer 101 as the conversion-diagram creation device includes a CPU 101a, a memory unit 101b, a display unit 101c, and an input unit 101d. The memory unit 101b has a control program Pr101 installed beforehand to create the conversion diagram 20 (see FIG. 4C) from the electronic circuit diagram 10. The computer 101 creates the conversion diagram 20 (see FIG. 4C) from the electronic circuit diagram 10 (see FIG. 4B) in accordance with the control program Pr101. In one example, when the operator presses the "convert" button on the input screen IM that displays the electronic circuit diagram 10 as shown in FIG. 4B, then the computer 101 creates the conversion diagram 20 (see FIG. 4C).

As shown in FIG. 4C, the conversion diagram 20 of the conversion diagram data D20 shows an image formed with the photothermal ink 45 to create insulating regions 12 (see FIG. 5C). The line width (thickness) and the height of the insulating regions 12 (see FIG. 5C) are specified with the line width (thickness) and the density of an image formed with the photothermal ink 45. In the example of FIG. 4C, the input screen IM has a configuration allowing the operator to select any region Ar1, Ar2 or Ar3 in the conversion diagram 20 and set any value of the thickness for the selected region.

<Creation of Circuit Board>

Referring to FIG. 5A to FIG. 5C, the following describes creation of the circuit board 30. FIG. 5A to FIG. 5C show creation examples of the circuit board 30.

In the example shown in FIG. 5A, a conducting region 13 is formed over the entire surface of the sheet material 40. The operator sets such a sheet material 40 at a not-illustrated printer. The operator then prints (applies) photothermal ink 45 at a region corresponding to the region of the thermally expandable layer 42 to be expanded (see FIG. 2A) with the not-illustrated printer as shown in FIG. 5B.

Next the operator disposes the sheet material 40 near a heater 103 (see FIG. 2B), and applies light to the sheet material 40 from the heater 103 (see FIG. 2B). The photothermal ink 45 of the sheet material 40 converts the applied light into heat. This generates heat at the printed part (see FIG. 5B) of the photothermal ink 45. As a result, the thermally expandable layer 42 (see FIG. 2B) of the sheet material 40 partially expands to define three-dimensional insulating regions 12 on the sheet material 40 as shown in FIG. 5C. After that, the operator peels off the microfilm 44 from the thermally expandable layer 42 (see FIG. 2C) to expose the thermally expandable layer 42 (see FIG. 2D). This creates the circuit board 30.

Such a circuit board 30 includes the insulating regions 12 that are formed by expanding desired regions, so as to configure an operating circuit. The circuit board 30 has a wiring function equivalent to a flexible wiring board and a universal board, for example.

The operator uses such a sheet material 40 having a circuit 11 formed thereon as the circuit board 30. The operator may separate any part from the sheet material 40 to create a various shaped circuit board 30.

Figure 6A:
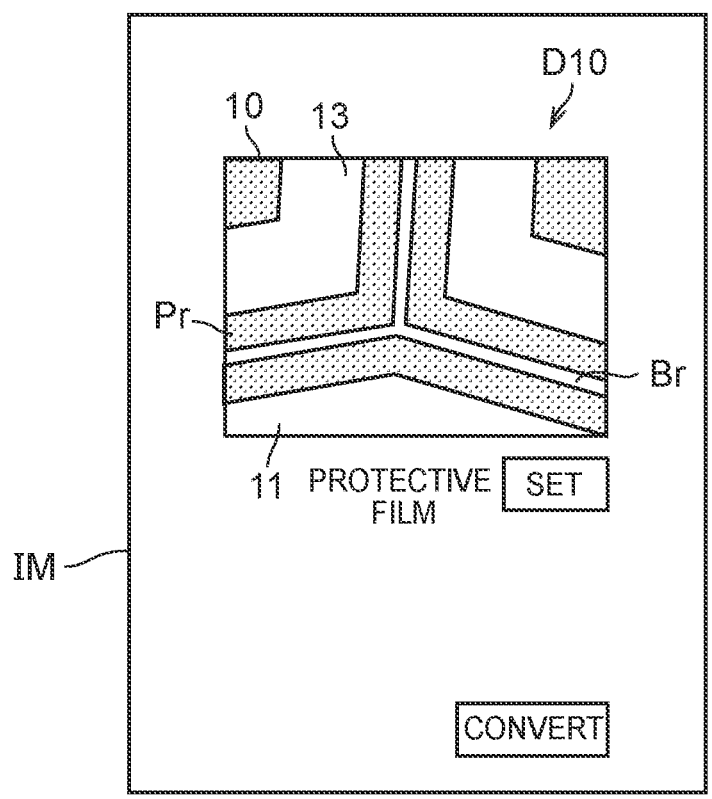
FIG. 6A shows an example of an electronic circuit diagram having a protective region.

In the example shown in FIG. 5C, the circuit 11 includes the conducting region 13 (including conducting regions 13a, 13b, 13c), and the entire face of the conducting region 13 is exposed. Preferably the circuit 11 is configured to avoid short-circuit at the conducting region 13 with metal, for example, that is placed on the conducting region 13. To this end, the circuit 11 in one example preferably has a protective region Pr protected with a protective film 29 (see FIG. 6C) described later in the conducting regions 13 as shown in FIG. 6A. FIG. 6A shows an example of the electronic circuit diagram 10 having such a protective region Pr.

In the example shown in FIG. 6A, the circuit 11 includes a part of the conducting region 13 that is exposed without the protective region Pr. In another example, the circuit 11 may include the protective region Pr over the entire face of the conducting region 13 other than the insulating region Br so as not to include the exposed part of the conducting region 13. An exposed part of the conducting region 13 may be used as a connecting terminal, for example.

Figure 6B:
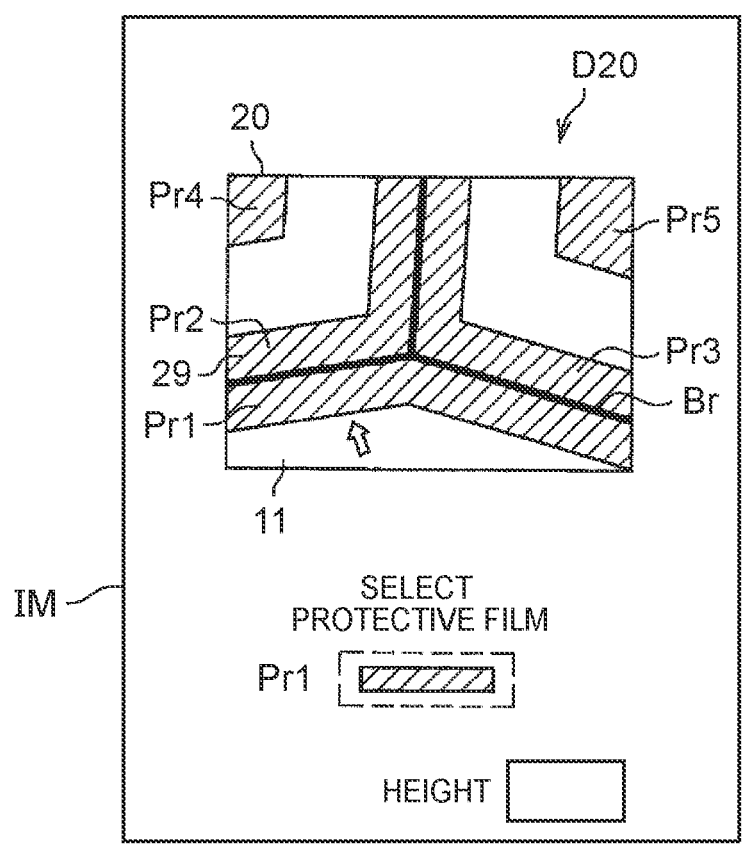
FIG. 6B shows a conversion diagram corresponding to an electronic circuit diagram having a protective region.

As shown in FIG. 6A, for example, the operator presses the "convert" button on the input screen IM that displays the electronic circuit diagram 10, so as to create a conversion diagram 20 (see FIG. 6B) with the computer 101. FIG. 6B shows the conversion diagram 20 corresponding to the electronic circuit diagram 10 having protective regions Pr.

As shown in FIG. 6B, the conversion diagram 20 of the conversion diagram data D20 shows an image of the regions to be formed with insulating ink so as to create a protective film 29 corresponding to the protective regions Pr. The line width (thickness) and the height of the protective film 29 are specified with the line width (thickness) and the density of an image formed with the insulating ink. In the example of FIG. 6B, the input screen IM has a configuration allowing the operator to select any protective region Pr1, Pr2, Pr3, Pr4 or Pr5 in the conversion diagram 20 and set any value of the density for the selected region.

Figure 6C:
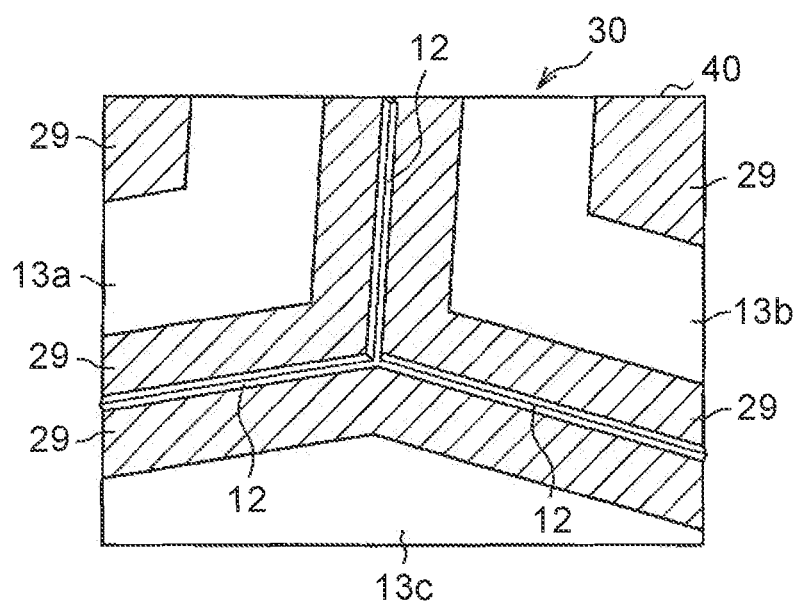
FIG. 6C shows a circuit board corresponding to an electronic circuit diagram having a protective region.

The operator sets the sheet material 40 of FIG. 5C at a not-illustrated printer. The operator then prints (applies) insulating ink at the protective regions Pr1, Pr2, Pr3, Pr4, and Pr5 (see FIG. 6B) with the not-illustrated printer. This creates the circuit board 30 having the protective film 29 at the conducting region 13 (conducting regions 13a, 13b and 13c) as shown in FIG. 6C. FIG. 6C shows the circuit board 30 corresponding to the electronic circuit diagram 10 having the protective regions Pr.

<Major Features of Sheet Material and Circuit Board>

The sheet material 40 of the present embodiment includes the base layer 41, and the thermally expandable layer 42 formed on the base layer 41. The thermally expandable layer 42 includes the microcapsules 51 and the binder 56 having a conducting property. Each microcapsule 51 includes the shell 52 having an insulating property and a thermally expandable component (core 53) contained in the shell 52 and having a property of expanding by heating. The shell 52 deforms due to the expansion of the thermally expandable component (core 53) and so comes in contact with another capsule to form an insulating region between these capsules.

The circuit board 30 of the present embodiment is formed by partially expansion of such a sheet material 40. In the circuit board 30 of the present embodiment, a not-expanding region of the thermally expandable layer 42 defines a conducting region of the circuit 11. The expanding region of the thermally expandable layer 42 defines an insulating region of the circuit 11. Such a circuit board 30 has a wiring function equivalent to a flexible wiring board and a universal board.

The circuit board 30 is created simply by printing a desired pattern corresponding to the conversion diagram 20 on the sheet material 40 with the photothermal ink 45, and partially expanding the sheet material 40. Such a circuit board 30 is manufactured using low-cost materials, and so is manufactured at low cost. Such a circuit board 30 is created easily in short time.

Such a circuit board 30 is created by manufacturing facility that is a general-purpose device (e.g., the computer 101 (see FIG. 4A), a printer (not illustrated), and the heater 103 (see FIG. 2B)) and is not a specialized device. The manufacturing cost of a circuit board 30 therefore reduces.

Such a circuit board 30 is created without jobs, such as soldering. The circuit board 30 can reduce burden on the operator to create the circuit board. A large amount of such a circuit board 30 is manufactured in short time.

Since the circuit board 30 is at low cost, the operator may create a plurality of types of circuit board 30 in small amounts, for example. The operator therefore may create a plurality of types of circuit boards 30 as prototypes of a circuit used for the product being developed, for example, and may conduct various tests with these created circuit boards 30.

The line width (thickness) and the height of the insulating regions 12 (see FIG. 5C) in the circuit board 30 are specified with the line width (thickness) and the density of an image formed with the photothermal ink 45. The degree of insulation of such a circuit board 30 may be controlled with the line width (thickness) and the density of an image formed with the photothermal ink 45.

The circuit board 30 may have a different degree of insulation in accordance with the expansion height of the expanding region of the thermally expandable layer 42. In other words, the operator may know a change in the degree of insulation in accordance with the expansion height of the expanding region. For instance, when the operator touches the expanding region of such a circuit board 30 with their hand, then the operator may know a change in the degree of insulation from the tactile sensing with the hand. In other words, the circuit board 30 allows the operator to know a change in the degree of insulation based on the tactile sensing with the hand in addition to the visual sense.

The circuit board 30 may change the degree of insulation with the expansion height of the expanding region (i.e., the printed density of an image formed with the photothermal ink 45), and so may change the value of surface resistance at the conducting region to some extent.

After the circuit 11 is formed on the circuit board 30, the photothermal ink 45 may be printed and be partially expanded again. This changes the original circuit 11 to another circuit or changes the original circuit 11 so as to hide the configuration of the circuit (i.e., to embed the original circuit 11 for deletion in the new expanding region). This allows the operator to conduct various tests of the created circuit 11 on the circuit board 30 before factory shipment, to change the original circuit 11 to another circuit, or to change the original circuit 11 so as to hide the configuration of the original circuit 11 for the factory shipment, for example. Such a circuit board 30 improves the confidentiality of the circuit 11.

The circuit board 30 has a high level of safety because it mainly includes paper or resin, such as PET. The circuit board 30 therefore may be used for teaching materials of science, teaching materials in science classes, and materials for handicraft for kids, for example.

As stated above, the sheet material 40 of the present embodiment provides a circuit board 30 having the wiring function equivalent to a flexible wiring board and a universal board, and that can be prepared easily in a short time and at low cost.

The present invention is not limited to the above embodiment, and may be changed or modified variously without departing from the scope of the invention.

For instance, the embodiment as stated above shows the details for illustrative purpose of the gist of the present invention. The present invention therefore is not limited to the example including all of the elements described above. The present invention may include another component added to a certain component of the components as stated above, or may include other components instead of some components of the components as stated above. A part of the components as stated above of the present invention may be omitted.

Figure 7A:
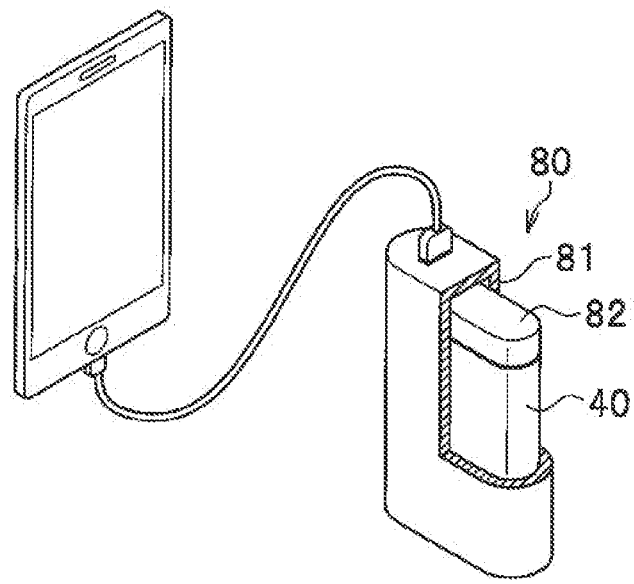
FIG. 7A is drawing (1) that shows an electronic apparatus including the sheet material.
Figure 7B:
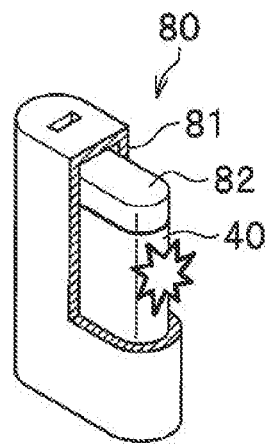
FIG. 7B is drawing (2) that shows an electronic apparatus including the sheet material.
Figure 7C:
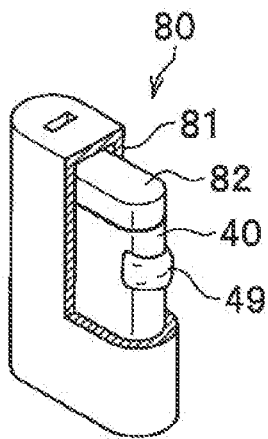
FIG. 7C is drawing (3) that shows an electronic apparatus including the sheet material.

In one example, an electronic apparatus 80 shown in FIG. 7A to FIG. 7C may be created using the sheet material 40 of FIG. 1A. FIG. 7A to FIG. 7C show the electronic apparatus 80 including the sheet material 40. The following describes the electronic apparatus 80 that is a battery device as one example. The battery device connects to a mobile device, such as smart phone, so as to supply electricity to the mobile device.

In the example of FIG. 7A, the electronic apparatus 80 includes a tank 82 inside of a case 81. The tank 82 is filled with electrolyte solution. The tank 82 is surrounded with the sheet material 40. Assume the case where the tank 82 breaks and the solution leaks from the tank 82, for example, as shown in FIG. 7B. Assume that the tank 82 generates unexpected short-circuit because current flows at a part near the broken part of the tank 82 due to the solution from the tank, and heat at the expansion temperature of the sheet material 40 or higher is generated near the broken part.

In this case, the sheet material 40 expands near the broken part as shown in FIG. 7C. The expanding sheet material 40 closes the tank 82 near the broken part so as to suppress leakage of the solution. The expanding region of the sheet material 40 defines an insulating region. The expanding region of the sheet material 40 therefore suppress short-circuit due to the solution leaking from the tank, and so lowers the temperature near the broken part. Such an electronic apparatus 80, in case of breakage, improves the safety of the apparatus.

The electronic apparatus 80 is not limited to a battery device, and may be another device as long as the sheet material 40 surrounds a part of the device where heat generation is expected. Thermally expandable ink 50 (thermally expandable material) may be applied to a part of the electronic apparatus 80 where heat generation is expected. In another example, the sheet material 40 may surround a temperature sensor of a fire alarm or a fuse of the electronic apparatus 80.

Figure 8A:
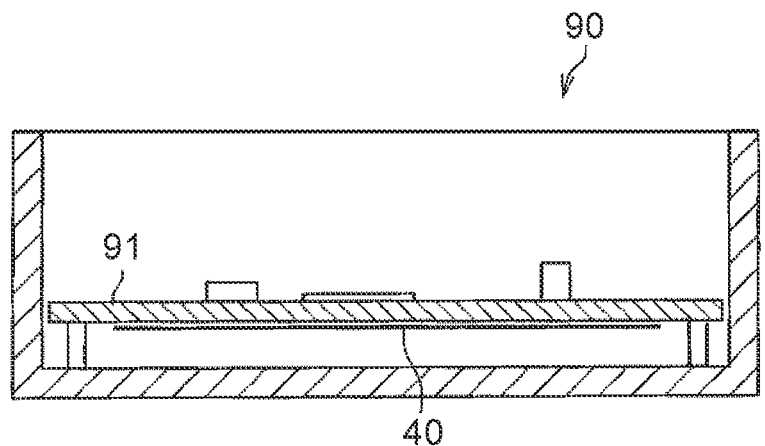
FIG. 8A is drawing (1) that shows a structure to analyze a heat-generation position based on the sheet material.
Figure 8B:
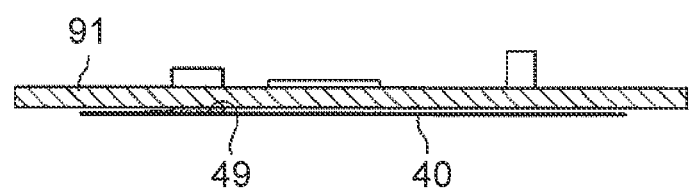
FIG. 8B is drawing (2) that shows a structure to analyze a heat-generation position based on the sheet material.
Figure 8C:
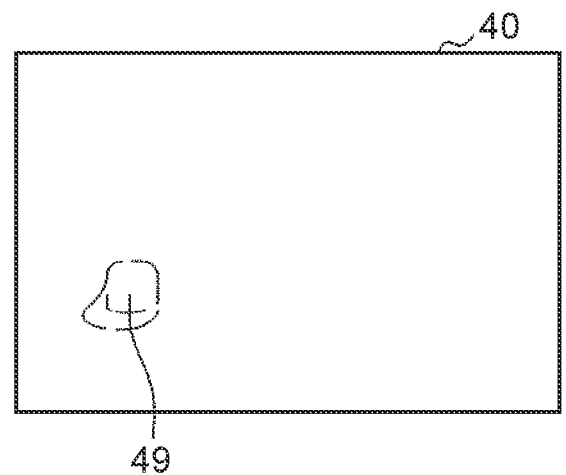
FIG. 8C is drawing (3) that shows a structure to analyze a heat-generation position based on the sheet material.
Figure 9A:
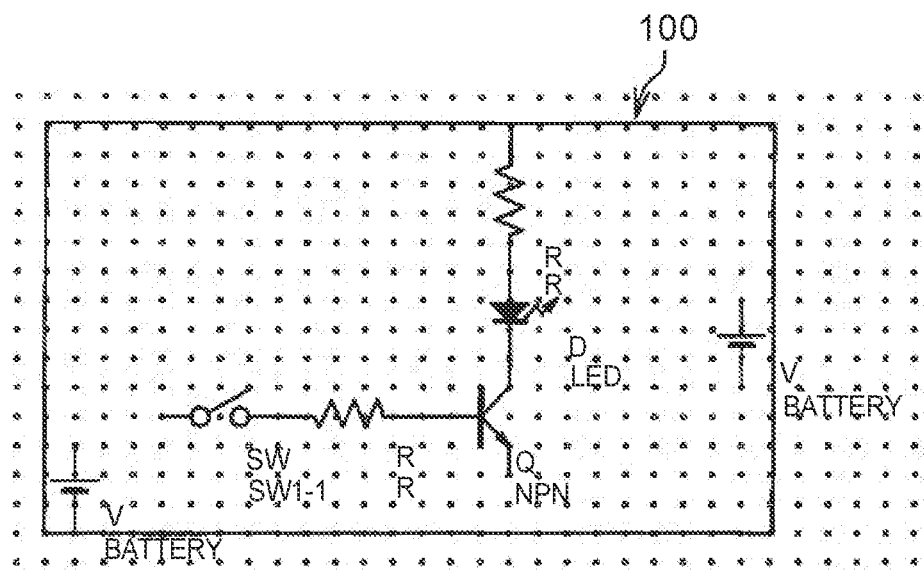
FIG. 9A shows an example of an electronic circuit diagram.
Figure 9B:
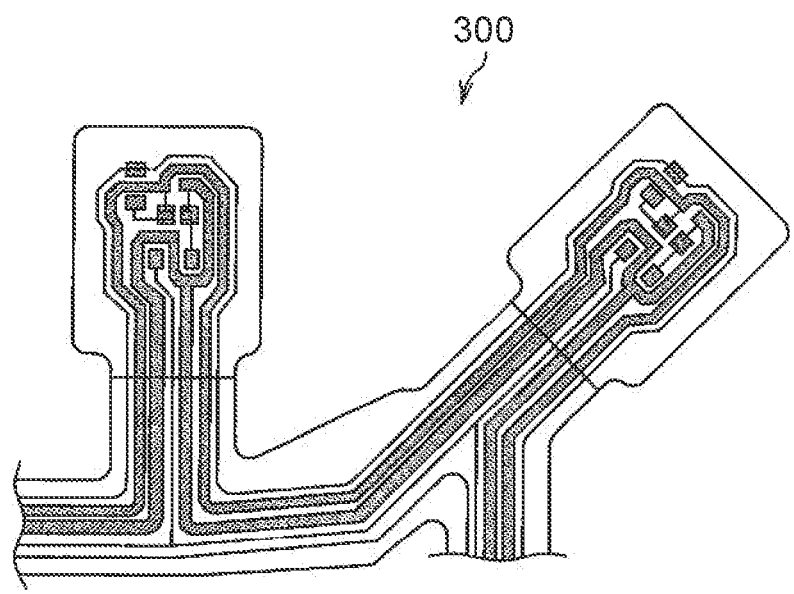
FIG. 9B shows one example of a flexible wiring board.
Figure 9C:
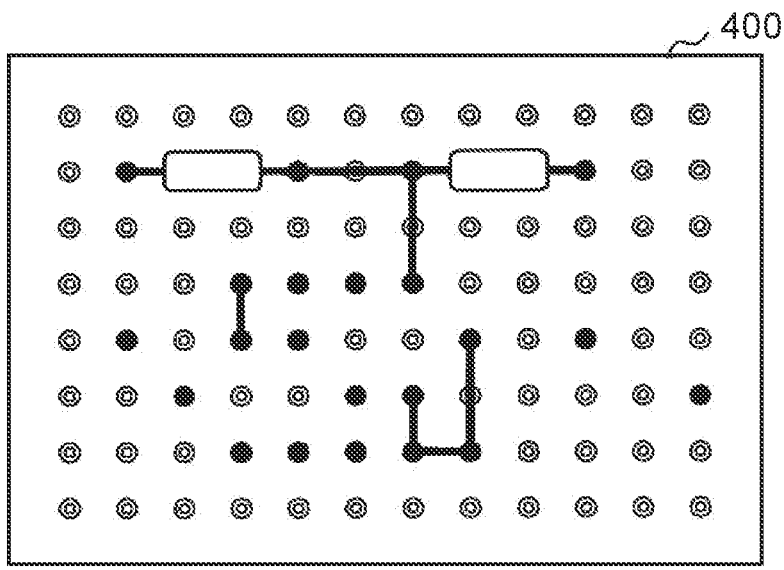
FIG. 9C shows one example of a universal board.

In one example, a structure to analyze a heat-generation position 90 as shown in FIG. 8A to FIG. 8C is created with the sheet material 40 shown in FIG. 1A. FIG. 8A to FIG. 8C show the structure to analyze a heat-generation position 90 including the sheet material 40. The following describes the case where the structure to analyze a heat-generation position 90 is applied to a desktop computer, and a heat-generation position of the circuit board 91 is analyzed.

In the example of FIG. 8A, the structure to analyze a heat-generation position 90 is applied to a computer. The computer internally includes a circuit board 91, and the sheet material 40 is disposed under the circuit board 91. Assume the case where heat at the expansion temperature of the sheet material 40 or higher is generated in the circuit board 91. In this case, the sheet material 40 expands near the heat-generation position, and an expanding part 49 is formed as shown in FIG. 8B. In such a case, the operator removes the sheet material 40 from the computer as shown in FIG. 8C to check the expanding part 49 of the sheet material 40. This allows the operator to analyze which part of the analysis target (circuit board 91) generated heat.

Preferably the sheet material 40 has a laminated structure of a plurality of types of thermally expandable layers 42

(FIG. 1A) each having a different expansion temperature. This allows the structure to analyze a heat-generation position 90 to analyze which part of the analysis target (circuit board 91) generated heat and what a degree of temperature the heat reached. Such a plurality of layers of the expanded part 49 of the sheet material 40 allows the structure to analyze a heat-generation position 90 to analyze how the heat is transmitted through the analysis target (circuit board 91).

When a problem leading to heat generation occurs in the analysis target (circuit board 91), conventional techniques may fail to reproduce a phenomenon of the problem. On the contrary, the structure to analyze a heat-generation position 90 of the present invention leaves the trace of a heat-generation position in the analysis target (circuit board 91) so as to be visible by the operator. In this way, the structure to analyze a heat-generation position 90 of the present invention facilitates the operator's analysis of the problem in the analysis target (circuit board 91).

What is claimed is:

1. A thermally expandable material, comprising:
   microcapsules; and
   a binder having an electric conducting property,
   wherein:
   each microcapsule includes a shell having an insulating property, and a thermally expandable component contained in the shell and having a property of expanding by heating, and
   the shell deforms due to expansion of the thermally expandable component to come in contact with another microcapsule and have an insulating state with the another microcapsule.

2. A sheet material, comprising:
   a base layer; and
   a thermally expandable layer disposed on the base layer, the thermally expandable layer including microcapsules and a binder having an electric conducting property,
   wherein:
   each microcapsule includes a shell having an insulating property, and a thermally expandable component contained in the shell and having a property of expanding by heating, and
   the shell defines an insulating region due to expansion of the thermally expandable component.

3. The sheet material according to claim 2, wherein:
   in a not-insulating region other than the insulating region, the microcapsules expand only to a predetermined magnification, and
   in the insulating region, the microcapsules expand to a predetermined magnification or more.

4. A circuit board including the sheet material according to claim 2, the sheet material having a partially expanding part, wherein:
   a not-expanding region of the thermally expandable layer defines a conducting region of a circuit, and
   an expanding region of the thermally expandable layer defines an insulating region of the circuit.

5. The circuit board according to claim 4, further comprising a protective film on at least a part of the not-expanding region of the thermally expandable layer, the protective film including insulating ink having an insulating property.

6. The circuit board according to claim 4, wherein the thermally expandable layer includes a laminate of a plurality of layers including a plurality of types of the microcapsules, each type having a different expansion temperature.

7. An electronic apparatus having an electrically conductive binder through which an electric current flows, and comprising microcapsules disposed within the binder, each microcapsule including a shell having an insulating property, and a thermally expandable component contained in the shell and having a property of expanding by heating,
   the electronic apparatus being configured such that, in case of an unexpected short-circuit, the microcapsules expand due to heat generated from the short-circuit so as to insulate a part around the short-circuit.

8. A structure to analyze a heat-generation position, comprising a plurality of microcapsules disposed at positions within an electrically conductive binder of a product, each microcapsule including a shell having an insulating property, and a thermally expandable component contained in the shell and having a property of expanding by heating,
   the structure being configured to allow analysis of an expanding region, if any, of the microcapsules so as to enable analysis of an unexpected heat-generation position of the product.

* * * * *